(12) United States Patent
Yeon et al.

(10) Patent No.: US 10,438,994 B2
(45) Date of Patent: Oct. 8, 2019

(54) METHOD OF FABRICATING LIGHT EMITTING DEVICE PACKAGE

(71) Applicant: Samsung Electronics Co., Ltd., Suwon-si, Gyeonggi-do (KR)

(72) Inventors: Ji Hye Yeon, Suwon-si (KR); Sung Hyun Sim, Uiwang-si (KR); Ha Nul Yoo, Bucheon-si (KR); Dong Gun Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/992,316

(22) Filed: May 30, 2018

(65) Prior Publication Data
US 2019/0181181 A1    Jun. 13, 2019

(30) Foreign Application Priority Data

Dec. 12, 2017   (KR) .................... 10-2017-0170188

(51) Int. Cl.
*H01L 33/50*   (2010.01)
*H01L 27/15*   (2006.01)
(Continued)

(52) U.S. Cl.
CPC ........ *H01L 27/156* (2013.01); *H01L 33/0079* (2013.01); *H01L 33/22* (2013.01); *H01L 33/46* (2013.01); *H01L 33/505* (2013.01); *H01L 33/56* (2013.01); *H01L 33/58* (2013.01); *H01L 25/167* (2013.01); *H01L 33/62* (2013.01); *H01L 33/641* (2013.01); *H01L 2933/005* (2013.01);
(Continued)

(58) Field of Classification Search
None
See application file for complete search history.

(56) References Cited

U.S. PATENT DOCUMENTS 6,372,608 B1   4/2002   Shimoda et al.
6,645,830 B2   11/2003   Shimoda et al.
(Continued)

FOREIGN PATENT DOCUMENTS

KR   10-2015-0074367 A   7/2015
KR   10-1721846 B1       3/2017
(Continued)

*Primary Examiner* — Khaja Ahmad
(74) *Attorney, Agent, or Firm* — Lee & Morse, P.C.

(57) ABSTRACT

A method of fabricating a light emitting device package including forming a cell array that includes semiconductor light-emitters including first and second conductivity-type semiconductor layers and an active layer on a substrate, and a separation region, the cell array having a first surface contacting the substrate; exposing the first surface of the separation region by removing the substrate; forming a seed layer on the first surface in the separation region; forming a photoresist pattern on the light-emitters such that the photoresist pattern exposes the seed layer; forming a partition structure that separates the light-emitters by plating a region exposed by the photoresist pattern; forming light emitting windows of the partition structure by removing the photoresist pattern such that the light-emitters are exposed at lower ends of the light emitting windows; and forming wavelength converters by filling the light emitting windows with a wavelength conversion material.

20 Claims, 15 Drawing Sheets

(51) Int. Cl.
*H01L 33/54* (2010.01)
*H01L 33/56* (2010.01)
*H01L 33/58* (2010.01)
*H01L 33/62* (2010.01)
*H01L 33/46* (2010.01)
*H01L 33/22* (2010.01)
*H01L 33/00* (2010.01)
H01L 25/16 (2006.01)
H01L 33/64 (2010.01)

(52) U.S. Cl.
CPC .......... *H01L 2933/0025* (2013.01); *H01L 2933/0041* (2013.01); *H01L 2933/0058* (2013.01); *H01L 2933/0075* (2013.01); *H01L 2933/0091* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,082,926 B2 | 7/2015 | Freund et al. | |
| 9,209,339 B2 | 12/2015 | Chang et al. | |
| 9,419,190 B2 | 8/2016 | Barth et al. | |
| 9,661,716 B2 | 5/2017 | Oraw | |
| 9,704,833 B2 | 7/2017 | Kong et al. | |
| 2015/0270298 A1* | 9/2015 | Lin | H01L 27/14627 257/432 |
| 2015/0362165 A1* | 12/2015 | Chu | H01L 25/0753 362/235 |
| 2017/0236866 A1 | 8/2017 | Lee et al. | |
| 2017/0250164 A1* | 8/2017 | Takeya | H01L 25/0753 |
| 2017/0250316 A1 | 8/2017 | Yeon et al. | |
| 2017/0309798 A1 | 10/2017 | Bonar et al. | |

FOREIGN PATENT DOCUMENTS

| | | |
|---|---|---|
| KR | 10-2017-0084139 A | 7/2017 |
| KR | 10-2017-0100999 A | 9/2017 |

* cited by examiner

III-III'

METHOD OF FABRICATING LIGHT EMITTING DEVICE PACKAGE

CROSS-REFERENCE TO RELATED APPLICATION

Korean Patent Application No. 10-2017-0170188, filed on Dec. 12, 2017, in the Korean Intellectual Property Office, and entitled: "Method of Fabricating Light Emitting Device Package," is incorporated by reference herein in its entirety.

BACKGROUND

1. Field

Embodiments relate to a method of fabricating a light emitting device package.

2. Description Of the Related Art

Light emitting devices such as semiconductor light emitting diode (LED) devices have been used as light sources in various electronic products, as well as light sources for lighting devices. For example, light emitting devices may be used as light sources in various types of display devices such as televisions, mobile phones, personal computers (PCs), laptop PCs, and personal digital assistants (PDAs).

SUMMARY

The embodiments may be realized by providing a method of fabricating a light emitting device package, the method including forming a cell array that includes a plurality of semiconductor light-emitters, each of the plurality of semiconductor light-emitters including a first conductivity-type semiconductor layer, an active layer, and a second conductivity-type semiconductor layer stacked on a substrate for growth, and a separation region, the cell array having a first surface contacting the substrate for growth, and a second surface opposite to the first surface; exposing the first surface of the separation region by removing the substrate for growth; forming a seed layer on the first surface such that the seed layer is in the separation region; forming a photoresist pattern on the plurality of semiconductor light-emitters such that the photoresist pattern exposes the seed layer; forming a partition structure that separates the plurality of semiconductor light-emitters by plating a region exposed by the photoresist pattern; forming a plurality of light emitting windows of the partition structure by removing the photoresist pattern such that the plurality of semiconductor light-emitters are exposed at respective lower ends of the plurality of light emitting windows; and forming a plurality of wavelength converters by filling the plurality of light emitting windows with a wavelength conversion material.

The embodiments may be realized by providing a method of fabricating a light emitting device package, the method including forming a plurality of semiconductor light-emitters by stacking a first conductivity-type semiconductor layer, an active layer, and a second conductivity-type semiconductor layer on a substrate for growth and by etching a region thereof, the plurality of semiconductor light-emitters having a separation region therebetween exposing the substrate for growth; exposing the first conductivity-type semiconductor layer of each of the plurality of semiconductor light-emitters by removing the substrate for growth; forming a seed layer in the separation region; forming a photoresist pattern on the plurality of semiconductor light-emitters such that the photoresist pattern exposes the seed layer; forming a partition structure that separates the plurality of semiconductor light-emitters by plating a region exposed by the photoresist pattern; forming a plurality of light emitting windows of the partition structure by removing the photoresist pattern such that the plurality of semiconductor light-emitters are exposed at respective lower ends of the plurality of light emitting windows; and forming a plurality of wavelength converters by filling the plurality of light emitting windows with a wavelength conversion material.

The embodiments may be realized by providing a method of fabricating a light emitting device package, the method including disposing a plurality of semiconductor light-emitters on a substrate for growth such that each of the plurality of semiconductor light-emitters includes a first conductivity-type semiconductor layer, an active layer, and a second conductivity-type semiconductor layer, and are separated by a separation region; exposing the first conductivity-type semiconductor layer by removing the substrate for growth from the plurality of semiconductor light-emitters; forming a seed layer such that the seed layer is in the separation region; forming a photoresist pattern on the plurality of semiconductor light-emitters such that the photoresist pattern has a trench and the seed layer is exposed at a bottom of the trench; forming a partition structure having a plurality of light emitting windows respectively overlying to the plurality of semiconductor light-emitters by plating in the trench; exposing the plurality of light emitting windows by removing the photoresist pattern; and forming a plurality of wavelength converters by filling the plurality of light emitting windows with a wavelength conversion material.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
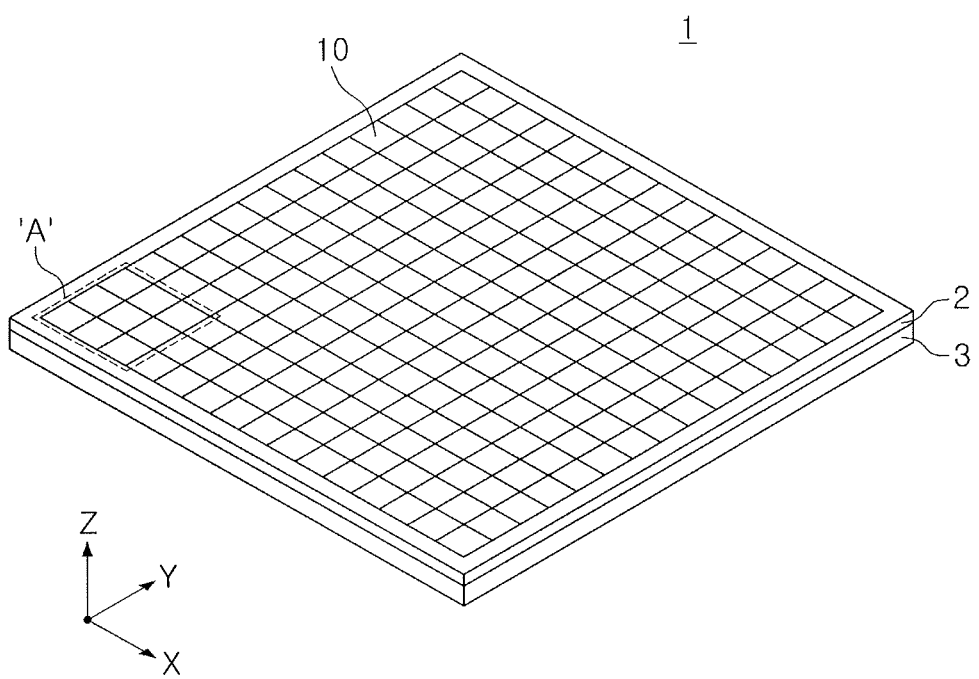
FIG. 1 illustrates a schematic perspective view of a display device having a light emitting device package, according to an example embodiment.
Figure 2:
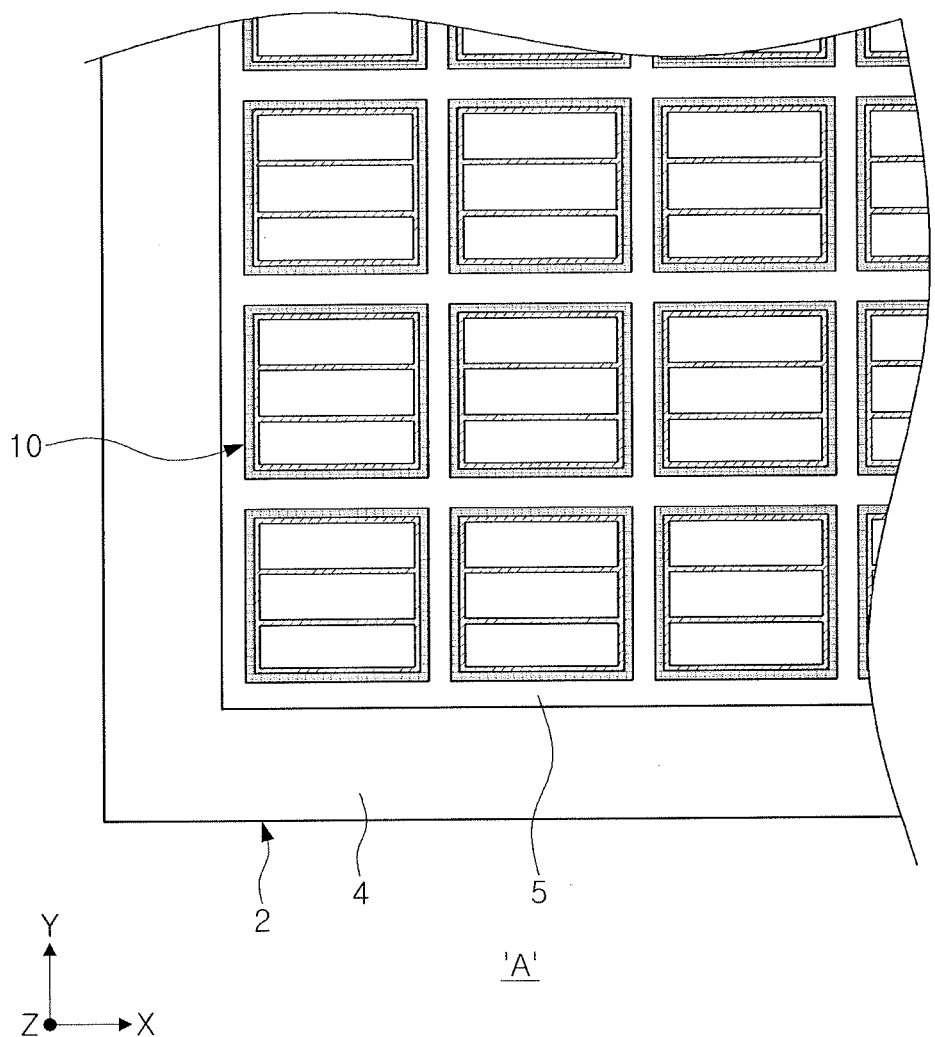
FIG. 2 illustrates an enlarged plan view of part "A" of FIG. 1.

FIG. 1 illustrates a schematic perspective view of a display device having a light emitting device package, according to an example embodiment. FIG. 2 illustrates an enlarged plan view of part "A" of FIG. 1.

Referring to FIG. 1, a display device 1 may include a circuit board 3, and a display panel 2 disposed on the circuit board 3.

According to the example embodiment, the display panel 2 may include a plurality of light emitting device packages 10 that may emit a mixture of red, green, and blue (RGB) light. Each of the light emitting device packages 10 may constitute a single pixel of the display panel 2, and may be disposed on the circuit board 3 to form rows and columns. In an implementation, the light emitting device packages 10 may be exemplified as being arranged in a 15×15 matrix. In an implementation, a larger number of light emitting device packages may be arranged, depending on a desired resolution (e.g., 1024×768 or 1920×1080).

The respective light emitting device packages 10 may include a plurality of subpixels corresponding to RGB light sources, and a plurality of subpixels of a single light emitting device package 10 may be disposed adjacent to each other. This configuration will be described in more detail, with reference to FIGS. 3 through 6. In an implementation, a cyan, yellow, magenta, or black (CYMK) light source may also be used as the subpixels. In an implementation, a single pixel may include three subpixels respectively corresponding to the RGB light sources. In an implementation, the single pixel may include four or more subpixels.

The circuit board 3 may include a driver configured to supply power to the respective light emitting device packages 10 of the display panel 2, and a controller controlling the driving part. The circuit board 3 may include a circuit configured to independently operate subpixels of each pixel. For example, the circuit board 3 may include a thin film transistor (TFT) substrate having a TFT.

Referring to FIG. 2, the display panel 2 may further include a first partition structure 4 defining a region in which the light emitting device packages 10 may be disposed. Further, the respective light emitting device packages 10 may be surrounded by a second partition structure 5. The second partition structure 5 may electrically separate the respective light emitting device packages 10 from each other, and each of the light emitting device packages 10 may thus be independently driven as a single pixel. Further, the second partition structure 5 may firmly fix the light emitting device packages 10 to the circuit board 3. In an implementation, the first and/or second partition structures 4 and 5 may be omitted.

The first and second partition structures 4 and 5 may include a black matrix. For example, the black matrix may be disposed around the circuit board 3 to function as a guide line defining a mounting region of the light emitting device packages 10. In an implementation, a color of the matrix may be other than black. In an implementation, white or green matrix may be used as the black matrix, depending on the purposes or uses of products, and a matrix formed of a transparent material may also be used. The white matrix may further include a reflective material or a light scattering material. In an implementation, the black matrix may include, e.g., a polymer containing a resin, a ceramic, a semiconductor, and a metal.

Figure 3:
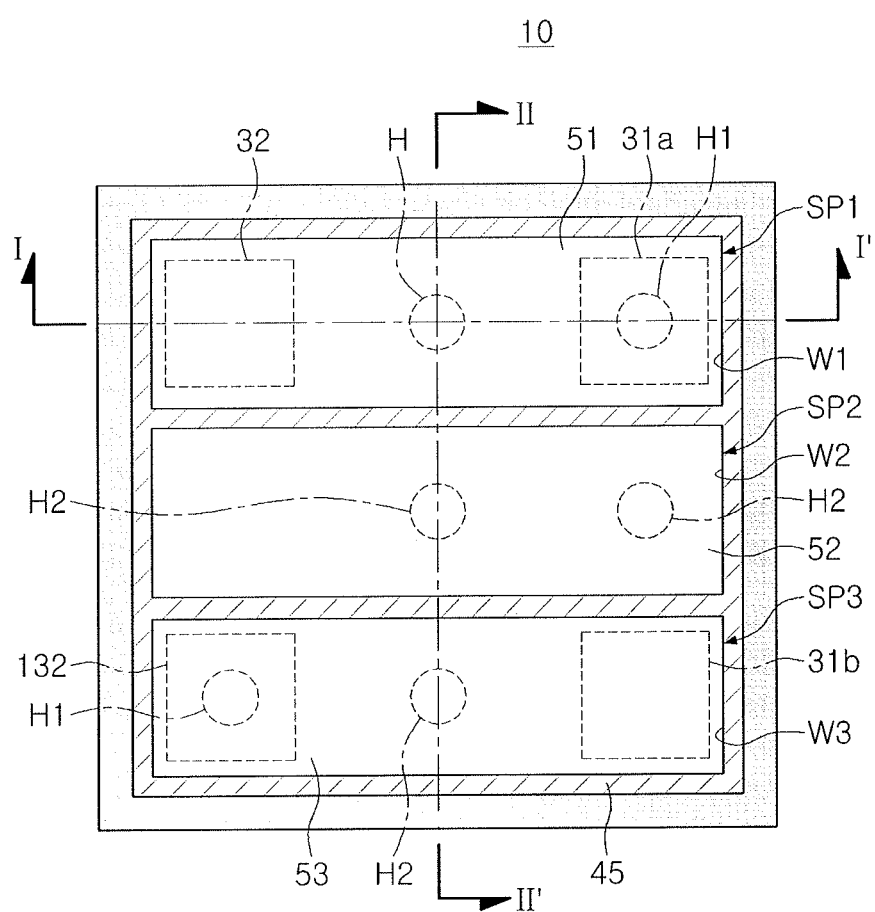
FIG. 3 illustrates a schematic plan view of a light emitting device package, according to an example embodiment.
Figure 4:
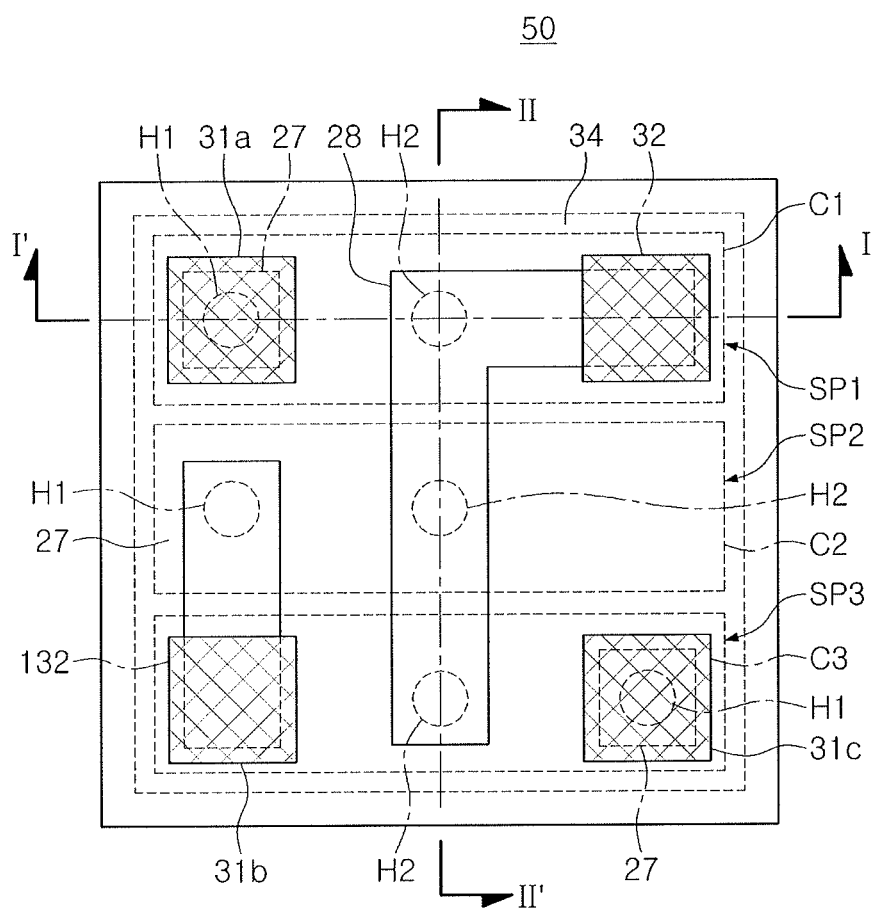
FIG. 4 illustrates a schematic rear view of the light emitting device package of FIG. 3.
Figure 5:
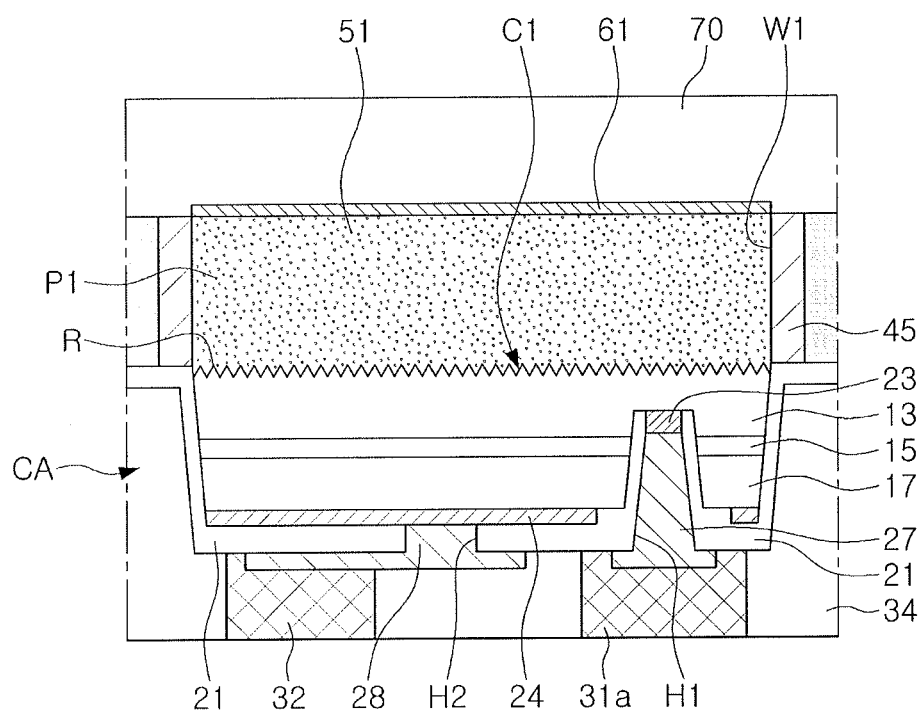
FIG. 5 illustrates a cross-sectional view of the light emitting device package taken along line I-I' of FIG. 3.
Figure 6:
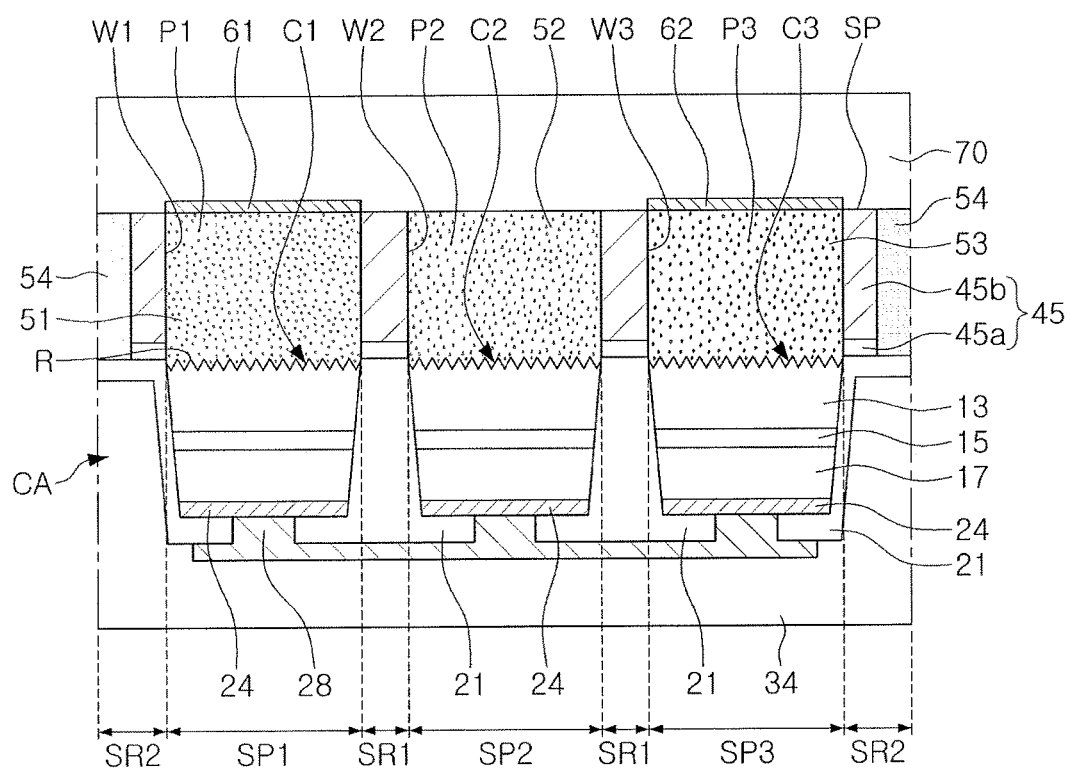
FIG. 6 illustrates a cross-sectional view of the light emitting device package taken along line II-II' of FIG. 3.

FIG. 3 illustrates a schematic plan view of a light emitting device package, according to an example embodiment. FIG. 4 illustrates a schematic rear view of the light emitting device package of FIG. 3. FIG. 5 illustrates a cross-sectional view taken along line I-I' of FIG. 3. FIG. 6 illustrates a cross-sectional view taken along line II-II' of FIG. 3.

Referring to FIG. 6, the light emitting device package 10, according to the example embodiment, may include a cell array CA having first to third semiconductor light-emitters C1 to C3, first to third wavelength converters 51 to 53 disposed on one surface of the cell array CA, such that the first to third wavelength converters 51 to 53 may correspond to the first to third semiconductor light-emitters C1 to C3 (e.g., may overlie or otherwise be located in the path of light emitted by the light-emitters), respectively, and a partition structure 45 separating the first to third wavelength converters 51 to 53.

In an implementation, the light emitting device package 10 may include first to third subpixels SP1 to SP3 respectively corresponding to RGB light sources of a single pixel. The first to third subpixels SP1 to SP3 may include the first to third semiconductor light-emitters C1 to C3 and the first to third wavelength converters 51 to 53, respectively. Thus, light emitted from the first to third semiconductor light-emitters C1 to C3 may be converted to light having a wavelength different from that of the emitted light via the first to third wavelength converters 51 to 53, and may be emitted. The first to third subpixels SP1 to SP3 may be disposed parallel to each other with the same area, when viewed from the above (refer to FIG. 3), and the partition structure 45 may separate the first to third subpixels SP1 to SP3.

As illustrated in FIGS. 5 and 6, each of the first to third semiconductor light-emitters C1 to C3 may include epitaxial layers, e.g., a first conductivity-type semiconductor layer 13, an active layer 15, and a second conductivity-type semiconductor layer 17. Such epitaxial layers may be grown from a single wafer by the same process. The active layers 15 of the first to third semiconductor light-emitters C1 to C3 may emit the same light. In an implementation, the active layer 15 may emit blue light, e.g., light having a wavelength of 440 nm to 460 nm, or ultraviolet light, e.g., light having a wavelength of 380 nm to 440 nm. In an implementation, an uneven pattern R may be formed on a surface of the first conductivity-type semiconductor layer 13 of each of the first to third semiconductor light-emitters C1 to C3, thus increasing light extraction efficiency, The cell array CA may include insulators 21 respectively surrounding the first to third semiconductor light-emitters C1 to C3. The insulators 21 may electrically separate the first to third semiconductor light-emitters C1 to C3 from each other. In an implementation, as illustrated in FIG. 6, the insulators 21 may be coplanar with the first to third semiconductor light-emitters C1 to C3 (e.g., a surface of the insulator 21 may be coplanar with a surface of the first to third semiconductor light-emitters C1 to C3).

The insulators 21 may include a material having electrical insulating properties. For example, the insulators 21 may include a silicon oxide, a silicon oxynitride, or a silicon nitride. In an implementation, the insulators 21 may additionally include a material having low light absorption or reflectivity, or a reflective structure. The insulators 21 may help block optical interference among the first to third semiconductor light-emitters C1 to C3, to help ensure independent driving of the first to third semiconductor light-emitters C1 to C3. In an implementation, the insulators 21 may have a distributed Bragg reflector (DBR) structure in which a plurality of insulating films having different refractive indexes are alternately stacked.

The insulators 21 and the partition structure 45 may be connected to each other. As described above, the insulators 21 and the partition structure 45 may extend from a space between the first to third semiconductor light-emitters C1 to C3 to a space between the first to third wavelength converters 51 to 53, thus effectively blocking optical interference among the subpixels on the overall optical path.

The light emitting device package 10 may include an electrode disposed on the other surface of the cell array CA, and electrically connected to the first to third semiconductor light-emitters C1 to C3. The electrode may be configured such that the first to third semiconductor light-emitters C1 to C3 are selectively driven.

In an implementation, as illustrated in FIG. 4, the electrode may include three first electrode pads 31a to 31c, respectively connected to three semiconductor light-emitters C1 to C3, and a second electrode pad 32 commonly connected to the three semiconductor light-emitters C1 to C3.

The three first electrode pads 31a to 31c may be independently connected to the first conductivity-type semiconductor layer 13 of each of the first to third semiconductor light-emitters C1 to C3 by three first connecting electrodes 27. The second electrode pad 32 may be commonly connected to the second conductivity-type semiconductor layer 17 of each of the first to third semiconductor light-emitters C1 to C3 by a single second connecting electrode 28. The first and second connecting electrodes 27 and 28 may be connected to the first and second conductivity-type semiconductor layers 13 and 17, respectively, through first and second through holes H1 and H2 formed in the insulators 21. The electrode employed in the example embodiment may further include first and second contact electrodes 23 and 24. The first and second through holes H1 and H2 may expose portions of the first and second contact electrodes 23 and 24 to be connected to the first and second connecting electrodes 27 and 28. While the first connecting electrodes 27 are formed in three first through holes H1, individually, the second connecting electrode 28 may be formed such that portions thereof formed in three second through holes H2 may be connected to each other. Such an electrode may vary depending on the arrangements of a cell and an electrode pad.

The light emitting device package 10 may include a molding 34 encapsulating the cell array CA and exposing the first electrode pads 31a to 31c and the second electrode pad. The molding 34 may have a high Young's modulus, in order to strongly support the light emitting device package 10. In an implementation, the molding 34 may contain a material having a high level of thermal conductivity, in order to effectively emit or dissipate heat generated by the first to third semiconductor light-emitters C1 to C3. For example, the molding 34 may include an epoxy resin or a silicone resin. In an implementation, the molding 34 may include light-reflective particles for reflecting light. In an implementation, the light-reflective particles may include, e.g., a titanium dioxide ($TiO_2$) or an aluminum oxide ($Al_2O_3$) particle.

The partition structure 45 may be disposed on the cell array CA in positions corresponding to those of a semiconductor light-emitter separation region SR1 and a device separation region SR2 on the first to third semiconductor light-emitters C1 to C3. The partition structure 45 may have first to third light emitting windows W1 to W3 (e.g,. spaces or openings therebetween) allowing beams of light from the first to third semiconductor light-emitters C1 to C3 to be emitted, respectively. The partition structure 45 may include a seed layer 45a disposed in a region contacting the cell array CA, and a plating layer 45b grown from the seed layer 45a through a plating process. The seed layer 45a may be formed as a single metal layer or multiple metal layers. When the seed layer 45a is formed as multiple layers, the same material as that of the plating layer 45b may be disposed in an uppermost layer of the layers.

The first to third light emitting windows W1 to W3 of the partition structure 45 may be provided as spaces for forming the first to third wavelength converters 51 to 53, respectively (e.g., the first to third light emitting windows W1 to W3 may be filled with the first to third wavelength converters 51 to 53 in the finally prepared light emitting device package). The partition structure 45 may be formed of a metal having a high level of reflectivity, such that beams of light, passing through the first to third wavelength converters 51 to 53, may not interfere with one another. For example, the partition structure 45 may be formed by plating a material including aluminum (Al), ruthenium (Ru), rhodium (Rh), gold (Au), silver (Ag), platinum (Pt), nickel (Ni). chromium (Cr), or copper (Cu) which are high-reflective metals. In an implementation, the partition structure 45 may be formed by plating an alloy of such materials, e.g., an Ag—Sn alloy. As illustrated in FIG. 6, an upper surface of the partition structure 45 (e.g., surface distal to the insulator 21) may form a coplanar surface SP with upper surfaces of the first to third wavelength converters 51 to 53.

A partition structure effective in blocking light may be employed between subpixels included in respective pixels of a display panel, in order for beams of light emitted from the subpixels to interfere with one another. The partition structure, having the light blocking effect, may be formed by etching a substrate for growth from which a semiconductor light-emitter may be grown, or may be formed of a resin into which a light-reflective material is dispersed. As the resolution of the display panel has been highly increased, the respective pixels may have a more compact size, and the thickness of the partition structure may be reduced to produce a compact pixel. A partition structure formed of such a material may allow transmission of light when having a certain thickness or less, thus may fail to adequately serve as a partition. Thus, even when the pixel has a compact size, the size of the subpixels may be required to be reduced, while the thickness of the partition is maintained. As a result, the resolution of the display panel may be highly increased, whereas an amount of light emitted from the respective pixels may be reduced, so an amount of light emitted from the entirety of the display panel may be decreased.

The light emitting device package 10, according to an example embodiment, may have the partition structure formed of a high-reflective metal, so that the thickness of the partition structure may be further reduced. Thus, the light emitting device package 10 may have a more compact size by significantly increasing the size of the subpixels while the distance between the subpixels is significantly decreased.

The first to third wavelength converters 51 to 53 may adjust or convert wavelengths of light emitted by the first to third semiconductor light-emitters C1 to C3, into wavelengths of light having different colors, respectively. In an implementation, the first to third wavelength converts 51 to 53 may emit green light, blue light, and red light, respectively. Upper surfaces of the first to third wavelength converters 51 to 53 may be flat, and may share the coplanar surface SP with one another. In an implementation, the upper surfaces of the first to third wavelength converters 51 to 53 may share the coplanar surface SP with the upper surface of the partition structure 45.

The first to third wavelength converters 51 to 53 may be formed by dispersing a wavelength conversion material, e.g., a phosphor or quantum dots (QDs), into a resin, such as silicone.

The first to third wavelength converters 51 to 53 may be formed by filling the first to third light emitting windows W1 to W3 with such a wavelength conversion material and then curing the wavelength conversion material. For example, the first to third wavelength converters 51 to 53 may be formed by mixing a phosphor or QDs with a material, such as silicone, dispensing, or printing, in an inkjet manner, the mixture into the first to third light emitting windows W1 to W3, and thermally curing the mixture.

In an implementation, optical filter layers 61 and 62 or a DBR layer may be further disposed on the upper surfaces of the first and third wavelength converters 51 and 53 to selectively block light having a certain wavelength. In an implementation, the light having a certain wavelength may be blue light emitted from the first and third semiconductor light-emitters C1 and C3, and the optical filter layers 61 and 62 and the DBR layer may be provided to selectively block the blue light. Thus, use of the optical filter layers 61 and 62 or the DBR layer may allow the first and third light emitting windows W1 and W3 to emit light from which blue light is removed.

The second wavelength converter 52 may be formed by dispensing a light transmitting liquid resin that is not mixed with a phosphor. In an implementation, the second wavelength converter 52 may include a blue or blue-green phosphor for adjusting color coordinates of blue light, e.g., a phosphor emitting light having a wavelength of 480 nm to 520 nm. Such a phosphor may be employed to adjust the color coordinates of blue light provided by the second wavelength converter 52, to thus be mixed in an amount less than that of a phosphor mixed in the first and third wavelength converters 51 and 53 for converting color of light into other colors. In an implementation, the second wavelength converter 52 may be replaced with a transparent resin layer that is not mixed with a phosphor.

The first to third wavelength converters 51 to 53 may have an encapsulator 70 disposed on the upper surfaces thereof to help prevent degradation of the wavelength conversion material. The encapsulator 70 may contact the first to third wavelength converters 51 to 53 and the partition structure 45, so as to be used as an optical waveguide for transmitting light emitted from the first to third wavelength converters 51 to 53.

Figure 7:
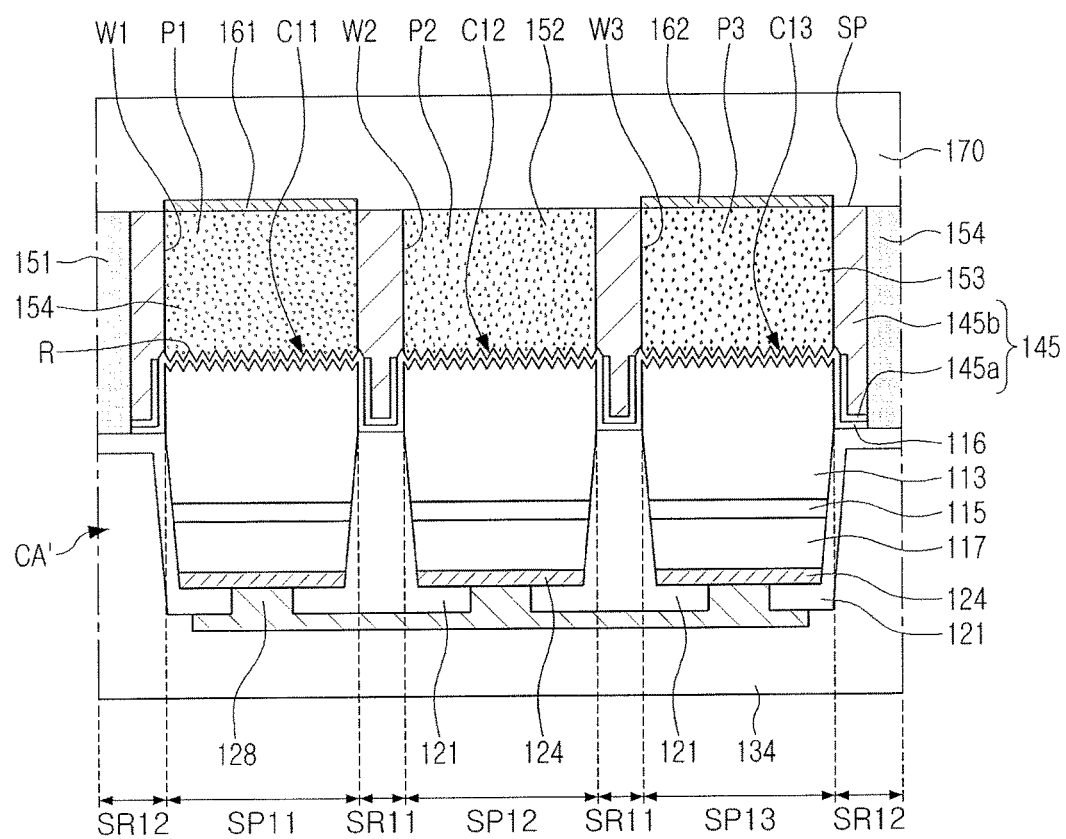
FIG. 7 illustrates a schematic cross-sectional view of a light emitting device package, according to an example embodiment.

FIG. 7 illustrates a cross-sectional view schematically showing a light emitting device package 100, according to an example embodiment. The present example embodiment differs from the above-described example embodiment in that first to third semiconductor light-emitters C11 to C13 may protrude from (e.g., higher than) upper portions of insulating layers 121, and that a refractive index matching layer 116 may be further formed on surfaces of the first to third semiconductor light-emitters C11 to C13 to help reduce the difference in refractive index between the first to third semiconductor light-emitters C11 to C13 and the first to third wavelength converters 151 to 153. The refractive index matching layer 116 may be formed of a light transmitting insulating material having a refractive index that is lower than that of the first to third semiconductor light-emitters C11 to C13 and higher than that of the first to third wavelength converters 151 to 153. Other configurations are the same as those in the above-described example embodiment, and a detailed description thereof may be omitted.

Figure 8:
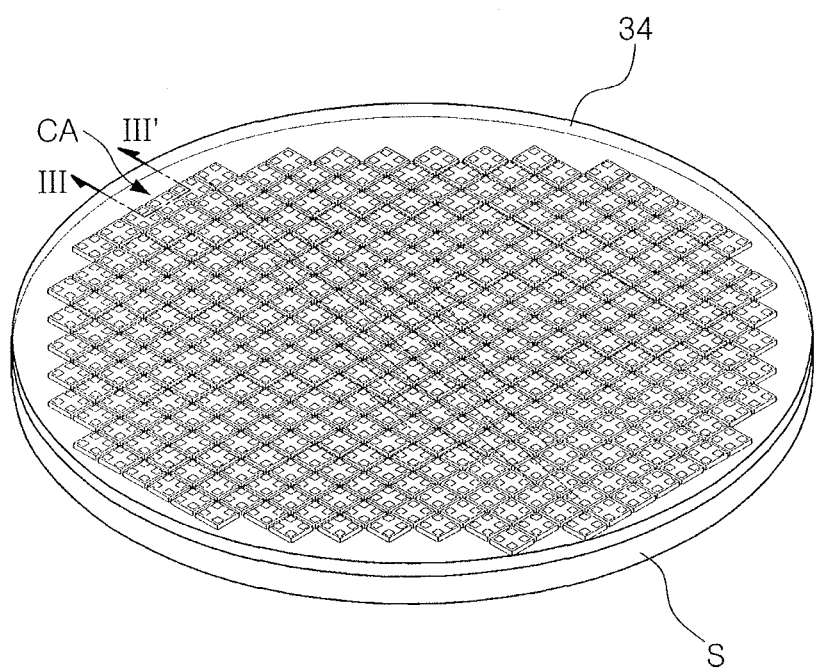
FIGS. 8 through 14 illustrate views of stages in a fabrication process for the light emitting device package of FIG. 6.
Figure 9:
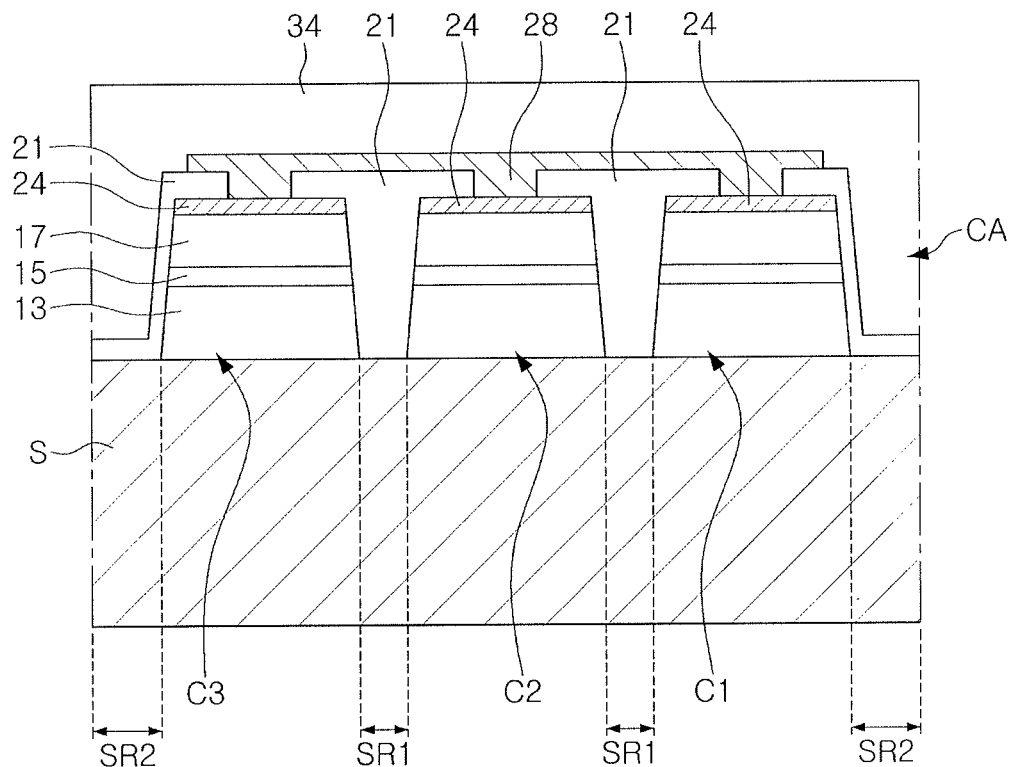

Referring to FIGS. 8 through 17, a method of fabricating a light emitting device package, according to an example embodiment, will be described. FIGS. 8 through 17 illustrate views schematically showing stages in a main fabrication process for the light emitting device package of FIG. 6. FIG. 9 illustrates a cross-sectional view taken along line of FIG. 8.

For example, the method of fabricating a light emitting device package relates to a method of fabricating a wafer-level chip scale package. A chip scale package may have substantially the same size as a semiconductor light emitting device package. Thus, when the chip scale package is used in a display panel, a high-resolution display panel may be manufactured by reducing a pixel size and a pixel pitch of the chip scale package. Also, all processes of the method of fabricating a wafer-level chip scale package may be performed on a wafer level, the method may be suited for mass production, and may enable an optical structure, such as a wavelength converter containing a phosphor or a filter, to be formed integrally with a semiconductor light-emitter.

As illustrated in FIGS. 8 and 9, a cell array CA may be prepared on a substrate for growth S (e.g., or simply a substrate), such as a wafer. The cell array CA may include the first to third semiconductor light-emitters C1 to C3, each having the first conductivity-type semiconductor layer 13, the active layer 15, the second conductivity-type semiconductor layer 17, the insulators 21 respectively surrounding the first to third semiconductor light-emitters C1 to C3, the second connecting electrode 28, and the molding 34. The first to third semiconductor light-emitters C1 to C3 may be spaced apart from each other with the semiconductor light-emitter separation region SR1 interposed therebetween, and the device separation region SR2 may be disposed in each region corresponding to that of an or separating each individual semiconductor light emitting device.

Figure 10:
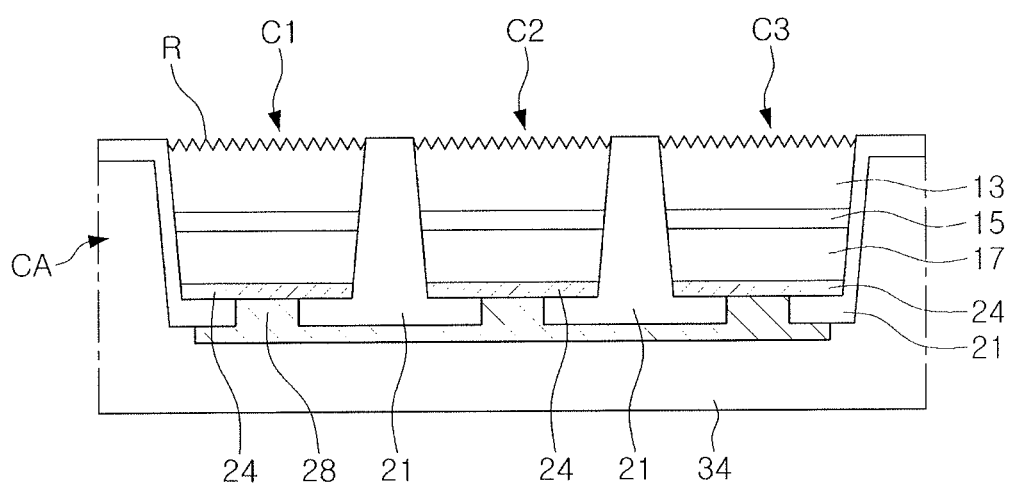

Subsequently, as illustrated in FIG. 10, the substrate for growth S may be separated from the cell array CA, so as to expose the first conductivity-type semiconductor layer 13 of the cell array CA. In an implementation, an uneven pattern R may be formed on the exposed surface of the first conductivity-type semiconductor layer 13, thus further increasing light extraction efficiency. Such an uneven pattern R may be obtained by wet etching the exposed surface of the first conductivity-type semiconductor layer 13 or dry etching the exposed surface using plasma. In an implementation, a temporary substrate for supporting the cell array CA may be attached to the cell array CA in separating the substrate for growth S.

Figure 11:
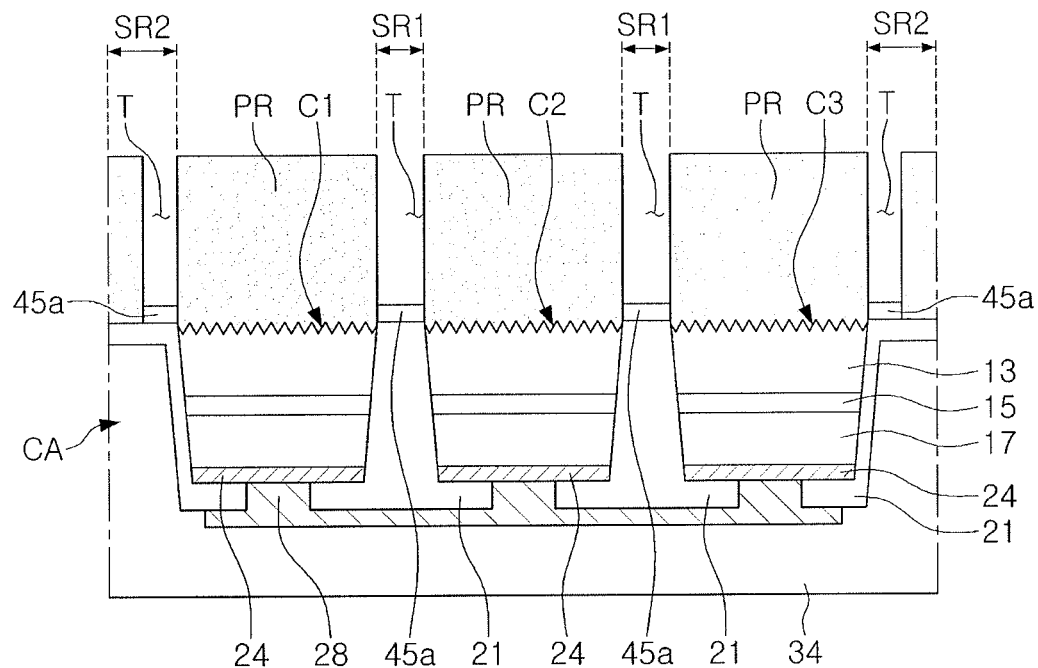

Subsequently, as illustrated in FIG. 11, a seed layer 45a may be formed in the semiconductor light-emitter separation region SR1 and the device separation region SR2, and a photoresist pattern PR may be formed to have a trench T such that the seed layer 45a is exposed at a bottom thereof. The seed layer 45a may allow the semiconductor light-emitter separation region SRI and the device separation region SR2 to be formed on the photoresist pattern PR. The photoresist pattern PR may have a greater thickness than a partition structure to be formed. For example, when a partition structure to be formed by the following process, such as a plating process, is to have a height of 10 μm, the photoresist pattern PR may have a thickness of 12 μm or more. For example, the trench T may be formed to have a greater thickness or depth than the thickness or height of the partition structure to be formed, which may help prevent an upper end portion of the partition structure from protruding on or out of the trench T in a spherical shape. In an implementation, a width of the trench T may range from 1 μμm to 20 μm. In an implementation, the partition structure 45 may have a height of greater than or equal to 10 μm.

The seed layer 45a may be formed of a single layer or multilayer structure formed of a material including aluminum (Al), ruthenium (Ru), rhodium (Rh), gold (Au), silver (Ag), platinum (Pt), nickel (Ni), chromium (Cr), or copper (Cu), or may be formed of an alloy of the material. The seed layer 45a may be formed by, e.g., a sputtering or physical vapor deposition (PVD) process.

Figure 12:
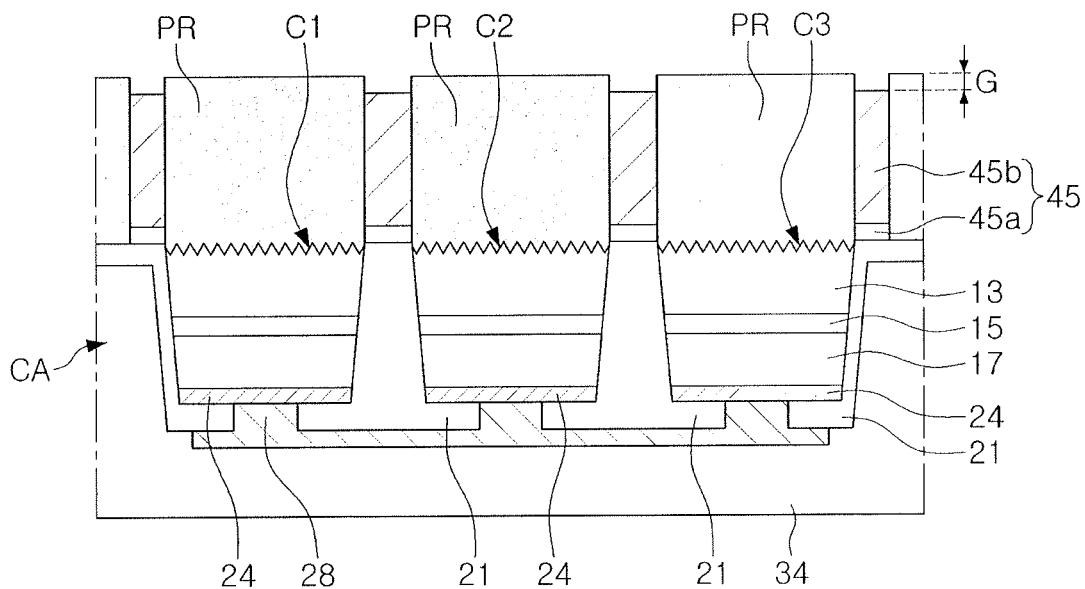

Subsequently, as illustrated in FIG. 12, a partition structure 45 may be provided by growing the seed layer 45a (at the bottom of the trench T), so as to form a plating layer 45b filling the trench T. The plating layer 45b may be formed by electroplating the same metal material as that of the seed layer 45a, e.g., aluminum (Al), ruthenium (Ru), rhodium (Rh), gold (Au), silver (Ag), platinum (Pt), nickel (Ni), chromium (Cr), or copper (Cu). The plating layer 45b may be grown to have a smaller thickness or height than the photoresist pattern PR by a certain gap G, which may help prevent the upper end portion of the partition structure 45 from undesirably protruding on the trench T in a spherical shape. The plating layer 45b may be formed by plating the trench T formed by a photolithography process, to thus have a very narrow width. Thus, the partition structure 45, having a further reduced thickness, may be formed as compared to that of other partition structures.

Figure 13:
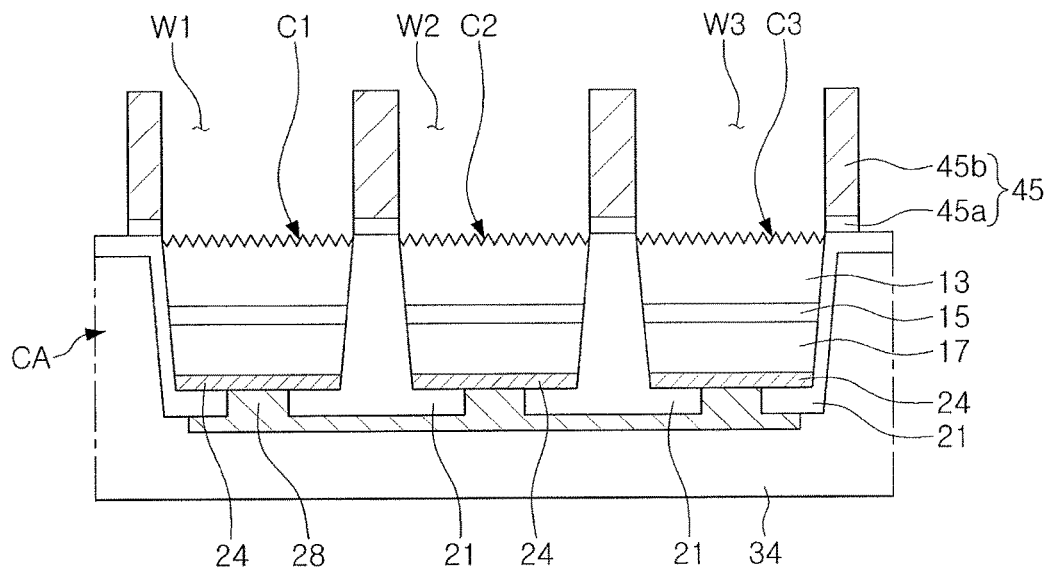

Subsequently, as illustrated in FIG. 13, the photoresist pattern PR may be removed to expose first to third light emitting windows W1 to W3 of the partition structure 45.

Figure 14:
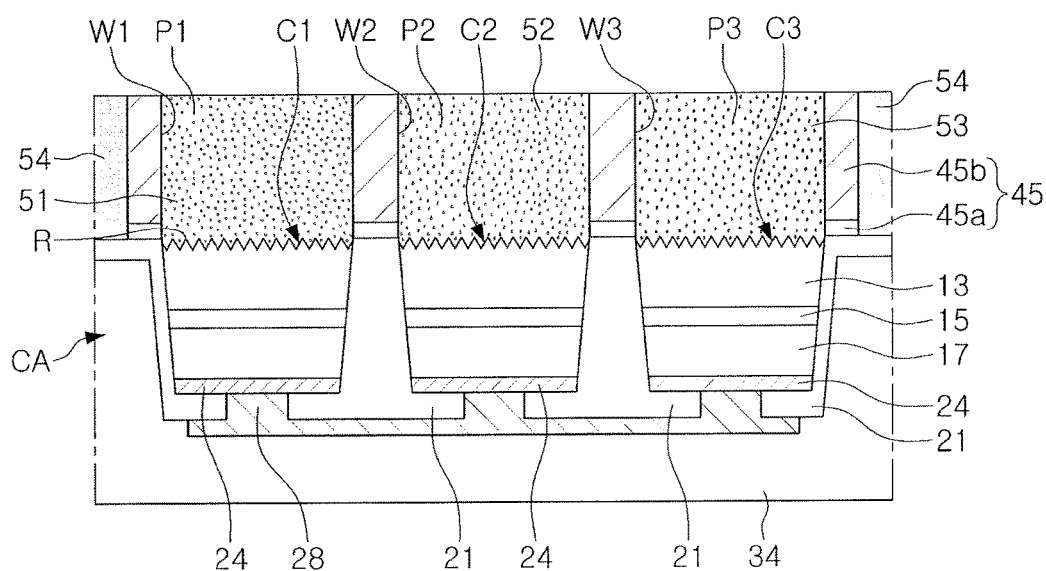

Subsequently, as illustrated in FIG. 14, a light transmitting liquid resin mixed with wavelength conversion materials, e.g., a green phosphor P1, a blue phosphor P2, and a red phosphor P3, may be dispensed into the first to third light emitting windows W1 to W3 to form first to third wavelength converters 51 to 53. In an implementation, a black matrix may be coated in the device separation region SR2 to help increase the contrast of the semiconductor light emitting device.

Subsequently, optical filter layers 61 and 62 may be disposed on the first to third light emitting windows W1 to W3, respectively, an encapsulator 70 may be formed on the optical filter layers 61 and 62, and then the resultant structure may be cut into individual semiconductor light emitting devices, thus resulting in the light emitting device package 10 illustrated in FIG. 6.

A method of fabricating a light emitting device package, according to another example embodiment, will be described. FIGS. 15 through 21 illustrate cross-sectional views of stages in a main fabrication process for the light emitting device package of FIG. 7.

Figure 15:
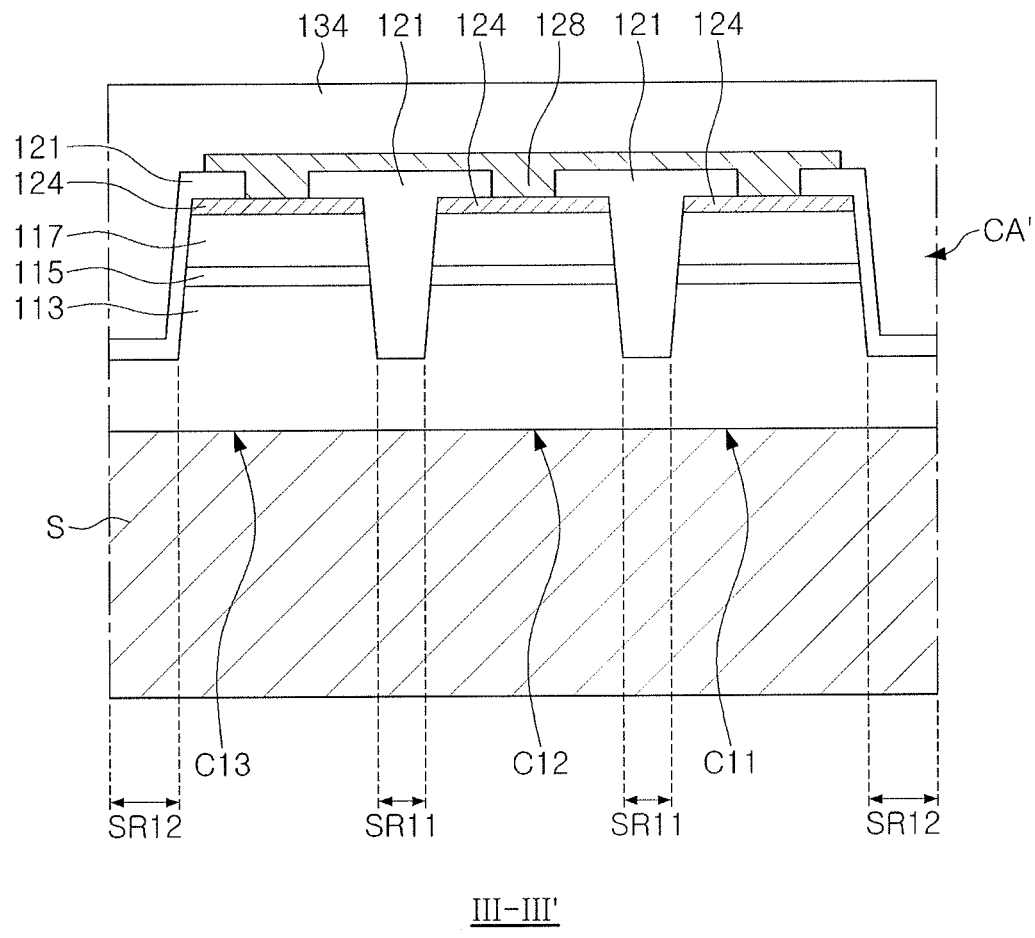
FIGS. 15 through 21 illustrate schematic cross-sectional views of stages in a fabrication process for the light emitting device package of FIG. 7.

As illustrated in FIG. 15, a light emitting structure, including a first conductivity-type semiconductor layer 113, an active layer 115, and a second conductivity-type semiconductor layer 117, may be formed on a substrate for growth S. A region of the light emitting structure may be etched to form a semiconductor light-emitter separation region SR11 separating first to third semiconductor light-emitters C11 to C13. In an implementation, a device separation region SR12, which may be a region separated into individual devices, may be formed. Insulators 21 may be formed to surround the first to third semiconductor light-emitters C1 to C3, respectively, and a connecting electrode 128 and a molding 134 may be formed, to provide a cell array CA'. Unlike in the above-described example embodiment, the first to third semiconductor light-emitters C11 to C13, according to an example embodiment, may share the first conductivity-type semiconductor layer 113.

Figure 16:
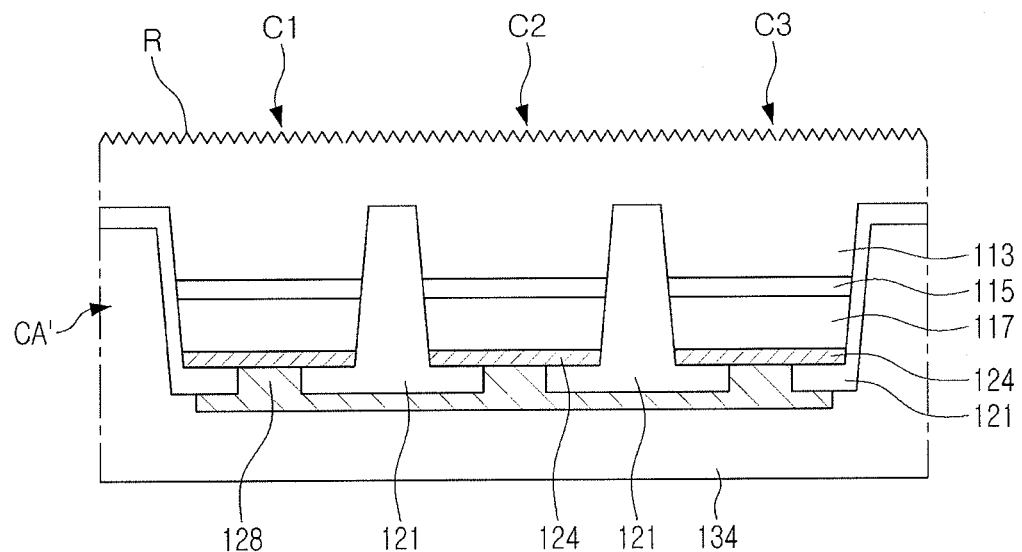

Subsequently, as illustrated in FIG. 16, the substrate for growth S may be separated from the cell array CA' to expose the first conductivity-type semiconductor layer 113 of the cell array CA'. In an implementation, an uneven pattern R may be formed on an exposed surface of the first conductivity-type semiconductor layer 113, and a temporary substrate for supporting the cell array CA' may be attached to the cell array CA' in separating the substrate for growth S.

Figure 17:
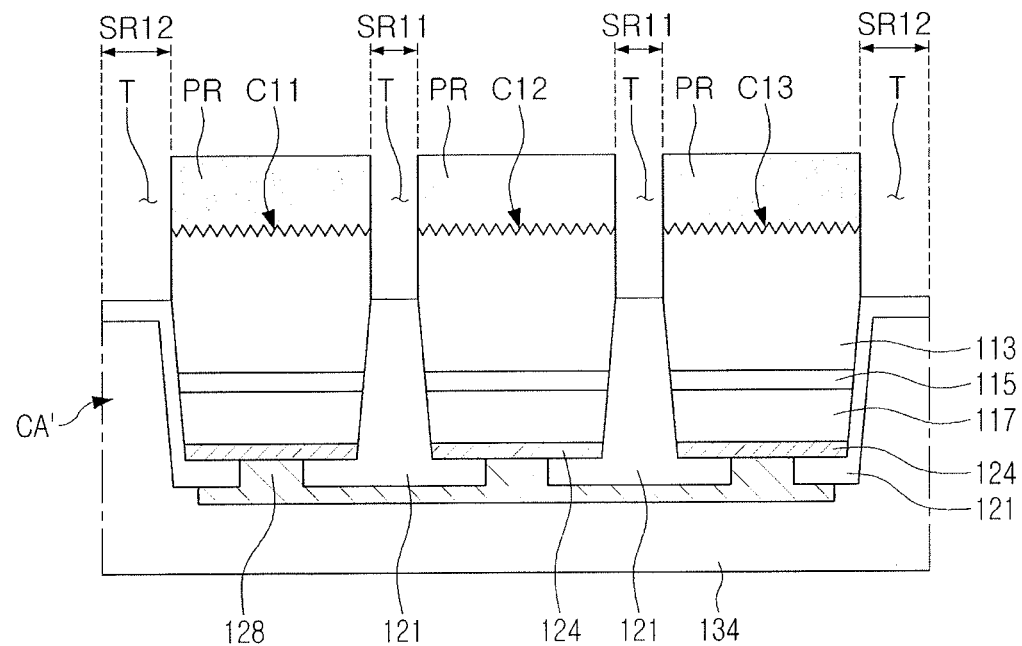

Subsequently, as illustrated in FIG. 17, a trench T, separating the first to third semiconductor light-emitters C11 to C13, may be formed in the semiconductor light-emitter separation region SR11 and the device separation region SR12 by coating a photoresist pattern PR and etching a region in which the photoresist pattern PR is not formed.

Figure 18:
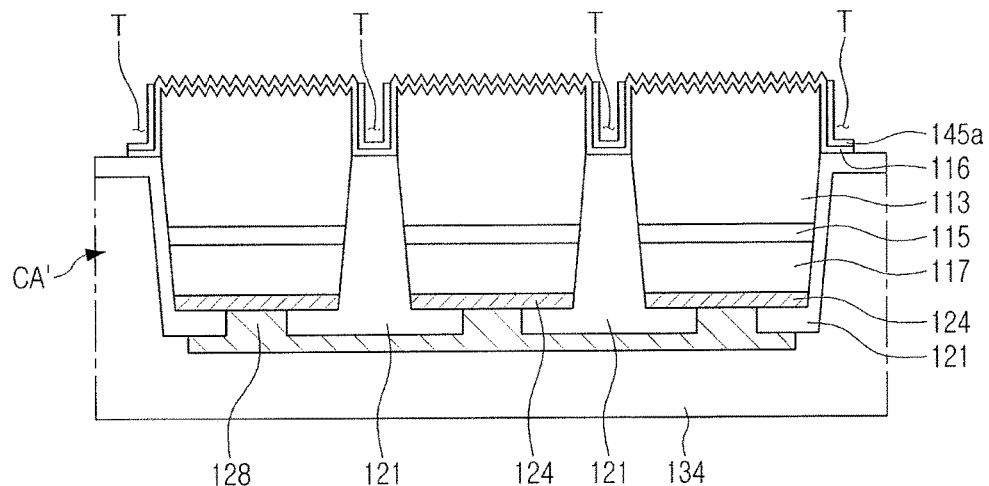
Figure 19:
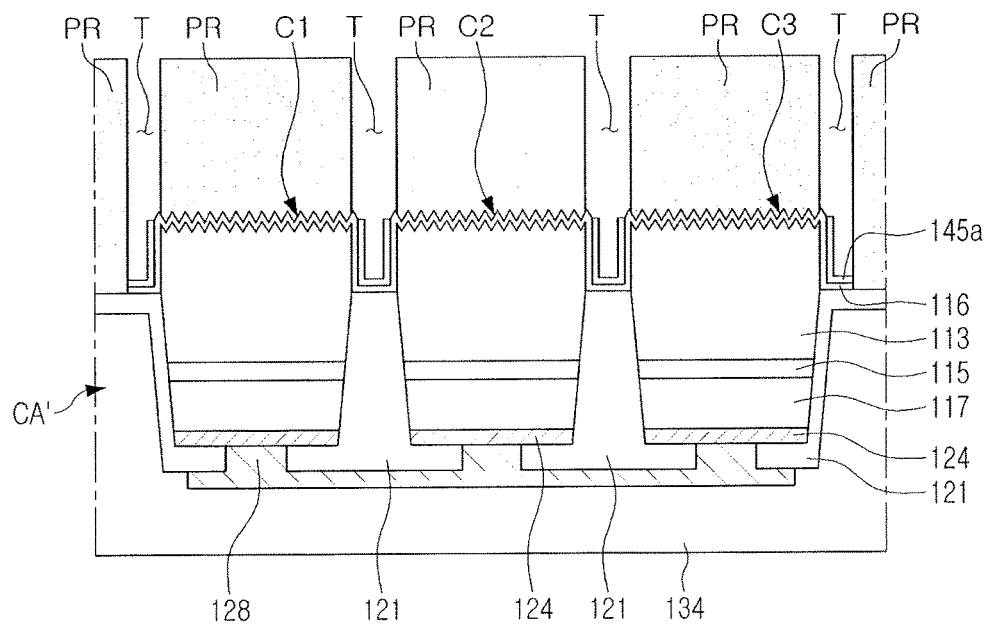

Subsequently, as illustrated in FIG. 18, a refractive index matching layer 116 and a seed layer 145a may be formed within the trench T, and as illustrated in FIG. 19, a photoresist pattern PR in which the seed layer 145a is exposed at a bottom of the trench T may be formed.

Figure 20:
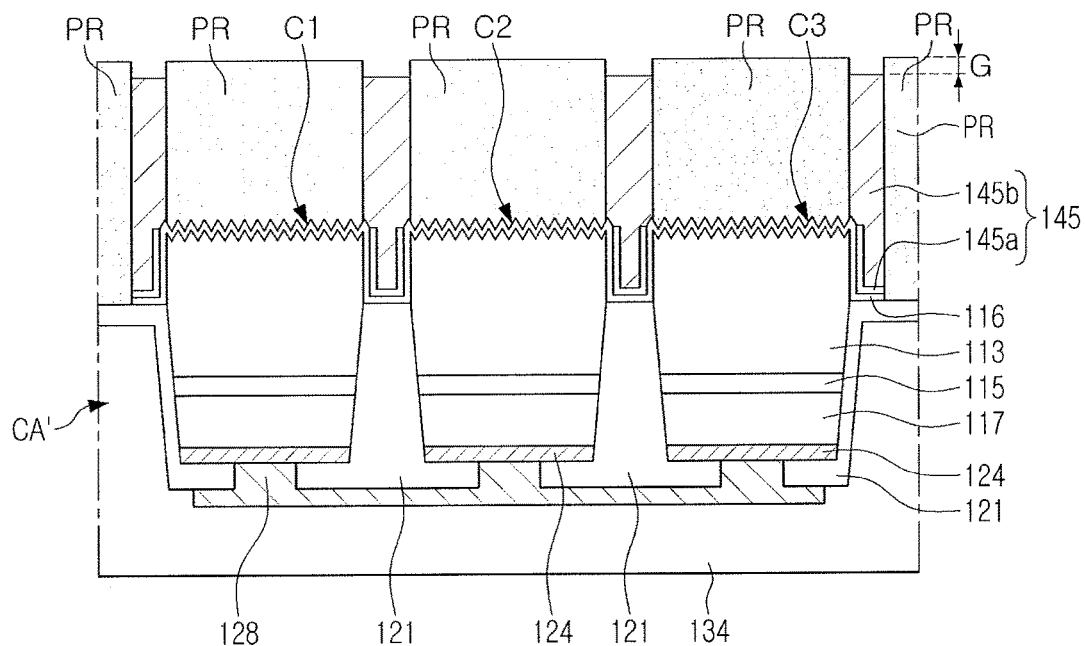

Subsequently, as illustrated in FIG. 20, a partition structure 145 may be provided by growing the seed layer 145a at the bottom of the trench T, so as to form a plating layer 145b filling the trench T.

Figure 21:
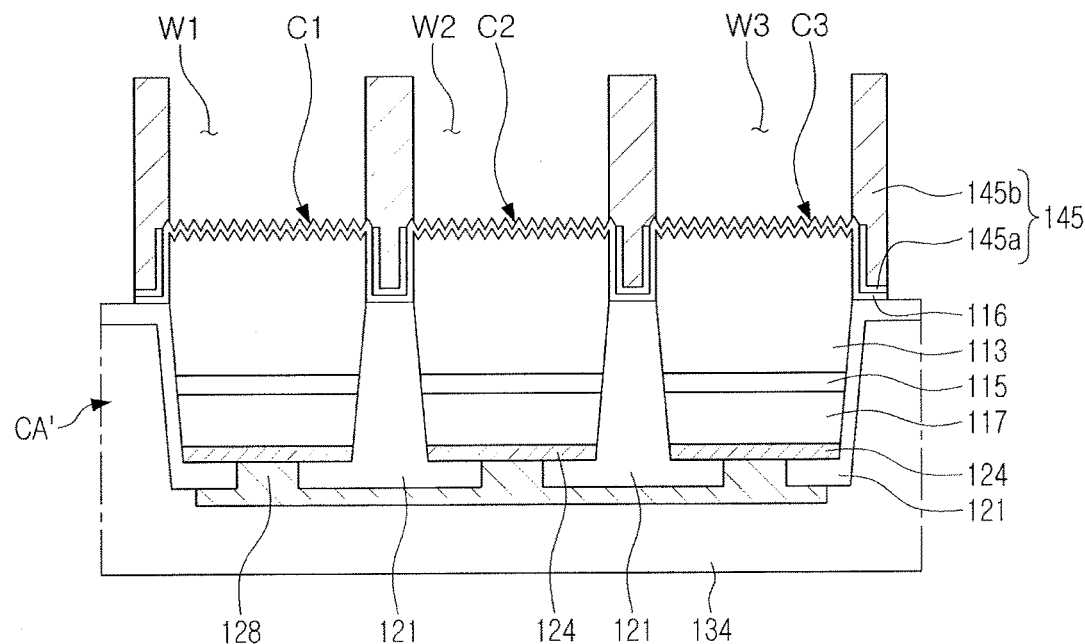

Subsequently, as illustrated in FIG. 21, the photoresist pattern PR may be removed to expose first to third light emitting windows W1 to W3 of the partition structure 145.

Subsequent processes may be the same as those of FIGS. 14 and 15 according to the above-described example embodiment, and a description thereof may be omitted.

By way of summation and review, some display devices have included display panels, e.g., liquid crystal display (LCD) panels, as well as backlight units. In recent years, display devices that do not require additional backlight units, through using an LED device as a single pixel, have been considered. Such display devices may have a compact size, and may be implemented as high brightness displays having improved optical efficiency, compared to LCDs. Display devices may also allow an aspect ratio of a display image to be freely changed, and may be implemented as large display devices, thereby providing various forms of large displays.

The embodiments may provide a method of fabricating a light emitting device package that may facilitate compactness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a light emitting device package, the method comprising:
   forming a cell array that includes:
   a plurality of semiconductor light-emitters, each of the plurality of semiconductor light-emitters including a first conductivity-type semiconductor layer, an active layer, and a second conductivity-type semiconductor layer stacked on a substrate for growth, and
   a separation region, the cell array having a first surface contacting the substrate for growth, and a second surface opposite to the first surface;
   exposing the first surface of the separation region by removing the substrate for growth;

forming a seed layer on the first surface such that the seed layer is in the separation region;

forming a photoresist pattern on the plurality of semiconductor light-emitters such that the photoresist pattern exposes the seed layer;

forming a partition structure that separates the plurality of semiconductor light-emitters by plating a region exposed by the photoresist pattern;

forming a plurality of light emitting windows of the partition structure by removing the photoresist pattern such that the plurality of semiconductor light-emitters are exposed at respective lower ends of the plurality of light emitting windows; and forming a plurality of wavelength converters by filling the plurality of light emitting windows with a wavelength conversion material.

2. The method as claimed in claim 1, wherein forming the partition structure includes growing the seed layer.

3. The method as claimed in claim 1, wherein the seed layer is formed of a material including aluminum (Al), ruthenium (Ru), rhodium (Rh), gold (Au), silver (Ag), platinum (Pt), nickel (Ni), chromium (Cr), or copper (Cu).

4. The method as claimed in claim 1, wherein the partition structure is disposed on a level that is lower than a level of the photoresist pattern.

5. The method as claimed in claim 1, wherein a width of the partition structure ranges from 1 μm to 20 μm.

6. The method as claimed in claim 1, wherein a height of the partition structure is greater than or equal to 10 μm.

7. The method as claimed in claim 1, wherein forming the cell array further includes forming an insulating layer that covers the plurality of semiconductor light-emitters.

8. The method as claimed in claim 7, wherein the insulating layer is disposed in the separation region.

9. The method as claimed in claim 1, further comprising forming an uneven pattern on the exposed first surface of the cell array prior to forming the photoresist pattern.

10. The method as claimed in claim 1, wherein the separation region exposes the substrate for growth.

11. The method as claimed in claim 1, wherein the separation region exposes the first conductivity-type semiconductor layer.

12. The method as claimed in claim 11, further comprising etching and removing a portion of the first conductivity-type semiconductor layer that overlaps the separation region after removing the substrate for growth.

13. The method as claimed in claim 12, further comprising forming a refractive index matching layer on surfaces of the plurality of semiconductor light-emitters after etching and removing the portion of the first conductivity-type semiconductor layer that overlaps the separation region such that the refractive index matching layer includes a light-transmitting insulating material.

14. The method as claimed in claim 13, wherein the refractive index matching layer is formed of a material having a refractive index that is lower than a refractive index of the plurality of semiconductor light-emitters and higher than a refractive index of the plurality of wavelength converters.

15. A method of fabricating a light emitting device package, the method comprising:

forming a plurality of semiconductor light-emitters by stacking a first conductivity-type semiconductor layer, an active layer, and a second conductivity-type semiconductor layer on a substrate for growth and by etching a region thereof, the plurality of semiconductor light-emitters having a separation region therebetween exposing the substrate for growth;

exposing the first conductivity-type semiconductor layer of each of the plurality of semiconductor light-emitters by removing the substrate for growth;

forming a seed layer in the separation region;

forming a photoresist pattern on the plurality of semiconductor light-emitters such that the photoresist pattern exposes the seed layer;

forming a partition structure that separates the plurality of semiconductor light-emitters by plating a region exposed by the photoresist pattern;

forming a plurality of light emitting windows of the partition structure by removing the photoresist pattern such that the plurality of semiconductor light-emitters are exposed at respective lower ends of the plurality of light emitting windows; and forming a plurality of wavelength converters by filling the plurality of light emitting windows with a wavelength conversion material.

16. The method as claimed in claim 15, further comprising planarizing surfaces of the plurality of wavelength converters after forming the plurality of wavelength converters.

17. The method as claimed in claim 16, wherein planarizing surfaces of the plurality of wavelength converters includes grinding, polishing, or chemical mechanical polishing.

18. The method as claimed in claim 17, further comprising:

disposing an optical filter layer on each of the plurality of wavelength converters after forming the plurality of wavelength converters; and forming an encapsulator on each of the plurality of wavelength converters so as to cover the optical filter layer.

19. A method of fabricating a light emitting device package, the method comprising:

disposing a plurality of semiconductor light-emitters on a substrate for growth such that each of the plurality of semiconductor light-emitters includes a first conductivity-type semiconductor layer, an active layer, and a second conductivity-type semiconductor layer, and are separated by a separation region;

exposing the first conductivity-type semiconductor layer by removing the substrate for growth from the plurality of semiconductor light-emitters;

forming a seed layer such that the seed layer is in the separation region;

forming a photoresist pattern on the plurality of semiconductor light-emitters such that the photoresist pattern has a trench and the seed layer is exposed at a bottom of the trench;

forming a partition structure having a plurality of light emitting windows respectively overlying to the plurality of semiconductor light-emitters by plating in the trench;

exposing the plurality of light emitting windows by removing the photoresist pattern; and forming a plurality of wavelength converters by filling the plurality of light emitting windows with a wavelength conversion material.

20. The method as claimed in claim 19, wherein forming the partition structure includes growing the seed layer along the trench.

* * * * *